US006413583B1

(12) United States Patent
Moghadam et al.

(10) Patent No.: US 6,413,583 B1
(45) Date of Patent: *Jul. 2, 2002

(54) FORMATION OF A LIQUID-LIKE SILICA LAYER BY REACTION OF AN ORGANOSILICON COMPOUND AND A HYDROXYL FORMING COMPOUND

(75) Inventors: Farhad K. Moghadam, Los Gatos; David W. Cheung, Foster City; Ellie Yieh; Li-Qun Xia, both of San Jose; Wai-Fan Yau, Mountain View; Chi-I Lang, Sunnyvale, all of CA (US); Shin-Puu Jeng, Hsinchu (TW); Frederic Gaillard, Voiron (FR); Shankar Venkataraman, Santa Clara; Srinivas Nemani, Milpitas, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/338,470

(22) Filed: Jun. 22, 1999

Related U.S. Application Data

(63) Continuation-in-part of application No. 09/021,788, filed on Feb. 11, 1998, now Pat. No. 6,054,379, and a continuation-in-part of application No. 09/247,381, filed on Feb. 10, 1999.

(51) Int. Cl.[7] .................. C23C 16/40; C23C 16/42; C23C 16/32; C23C 16/455; H01L 21/312; H01L 2/314

(52) U.S. Cl. .................. 427/249.15; 427/255.37; 427/579; 438/790; 438/789; 438/787; 438/763

(58) Field of Search ............... 427/563, 574, 427/579, 255.37, 249.15; 438/787, 788, 789, 790, 763

(56) References Cited

U.S. PATENT DOCUMENTS

| 4,303,632 A | 12/1981 | Gosser ............... 423/591 |
| 4,789,648 A | 12/1988 | Chow et al. ............ 437/225 |
| 4,845,054 A | 7/1989 | Mitchener |

(List continued on next page.)

FOREIGN PATENT DOCUMENTS

| DE | 19654737 A1 | 7/1997 | |
| DE | 198 04 375 A1 | 2/1998 | ......... H01L/21/312 |
| EP | 0 519 079 A1 | 12/1991 | |

(List continued on next page.)

OTHER PUBLICATIONS

Gessner Hawley, ed. *The Condesed Chemical Dictionary*, Van Noshand Reinhold Comp., 10th edition, excerpt. p. 545, 1981 (no month).*

European Patent Search Report Dated Oct. 26, 2000 In EP00112820 application.

(List continued on next page.)

*Primary Examiner*—Marianne Padgett
(74) *Attorney, Agent, or Firm*—Moser, Patterson & Sheridan LLP

(57) ABSTRACT

A method for depositing silicon oxide layers having a low dielectric constant by reaction of an organosilicon compound and a hydroxyl forming compound at a substrate temperature less than about 400° C. The low dielectric constant films contain residual carbon and are useful for gap fill layers, pre-metal dielectric layers, inter-metal dielectric layers, and shallow trench isolation dielectric layers in sub-micron devices. The hydroxyl compound can be prepared prior to deposition from water or an organic compound. The silicon oxide layers are preferably deposited at a substrate temperature less than about 40° C. onto a liner layer produced from the organosilicon compound to provide gap fill layers having a dielectric constant less than about 3.0.

6 Claims, 6 Drawing Sheets

U.S. PATENT DOCUMENTS

| | | | | |
|---|---|---|---|---|
| 5,082,647 | A | | 1/1992 | Chuang ................... 423/584 |
| 5,271,972 | A | | 12/1993 | Kwok et al. ................ 427/579 |
| 5,314,724 | A | | 5/1994 | Tsukune et al. |
| 5,360,646 | A | | 11/1994 | Morita ..................... 427/574 |
| 5,362,526 | A | | 11/1994 | Wang et al. |
| 5,429,995 | A | * | 7/1995 | Nishiyama et al. ......... 427/579 |
| 5,492,736 | A | | 2/1996 | Laxman et al. ............. 427/579 |
| 5,503,882 | A | * | 4/1996 | Dawson ..................... 427/579 |
| 5,506,443 | A | * | 4/1996 | Furumura ................. 257/635 |
| 5,578,523 | A | | 11/1996 | Fiordalice et al. ......... 437/190 |
| 5,593,741 | A | | 1/1997 | Ikeda ....................... 427/579 |
| 5,598,027 | A | | 1/1997 | Matsuura .................. 257/635 |
| 5,610,105 | A | | 3/1997 | Vines et al. ............... 437/235 |
| 5,683,940 | A | | 11/1997 | Yahiro |
| 5,691,247 | A | | 11/1997 | Lavie et al. ............... 437/225 |
| 5,693,563 | A | | 12/1997 | Teong ...................... 437/190 |
| 5,700,720 | A | | 12/1997 | Hashimoto |
| 5,703,404 | A | | 12/1997 | Matsuura |
| 5,710,079 | A | | 1/1998 | Sukharev .................. 438/778 |
| 5,739,579 | A | | 4/1998 | Chiang et al. ............. 257/635 |
| 5,789,319 | A | | 8/1998 | Havemann et al. ......... 438/668 |
| 5,807,785 | A | | 9/1998 | Ravi |
| 5,812,403 | A | | 9/1998 | Fong et al. ............ 364/468.28 |
| 5,843,535 | A | | 12/1998 | Dobson .................. 427/430.1 |
| 5,858,880 | A | | 1/1999 | Dobson et al. ............ 438/758 |
| 5,891,799 | A | | 4/1999 | Tsui ......................... 438/624 |
| 6,042,994 | A | * | 3/2000 | Yang et al. ................ 430/296 |
| 6,054,379 | A | * | 4/2000 | Yau et al. ................. 438/623 |
| 6,068,884 | A | | 5/2000 | Rose et al. |
| 6,080,526 | A | * | 6/2000 | Yang et al. ................ 430/296 |
| 6,114,032 | A | * | 9/2000 | Kelber ..................... 427/515 |
| 6,124,210 | A | * | 9/2000 | Chino et al. ............... 438/706 |
| 6,124,641 | A | | 9/2000 | Matsuura .................. 257/759 |
| 6,140,226 | A | | 10/2000 | Grill et al. ................. 438/637 |
| 6,159,871 | A | | 12/2000 | Loboda et al. ............. 438/786 |
| 6,255,221 | B1 | * | 7/2001 | Xia et al. .................. 438/710 |
| 6,313,035 | B1 | * | 11/2001 | Sandhu et al. ............. 438/681 |

FOREIGN PATENT DOCUMENTS

| | | | |
|---|---|---|---|
| EP | 0721019 A2 | 7/1996 | |
| EP | 0 743 675 A1 | 11/1996 | |
| EP | 0 774 533 A1 | 5/1997 | |
| EP | 0721019 A3 | 7/1997 | |
| EP | 0 885 983 A1 | 12/1998 | ........... C23C/16/30 |
| EP | 0 960 958 A2 | 1/1999 | |
| GB | 2317270 A | 9/1997 | |
| JP | WO 92/12535 | 7/1992 | |
| JP | 9-8031 | 1/1997 | |
| JP | 9-237785 | 9/1997 | ......... H01L/21/316 |
| WO | WO94/01885 | 6/1993 | |
| WO | WO98/08249 | 8/1997 | |
| WO | WO 98/59089 | 12/1998 | ........... C23C/16/30 |
| WO | WO 99/41423 | 9/1999 | |

OTHER PUBLICATIONS (L.C. Feldman, Murray Hill, and W.F. van der Weg, *Applied Surface Science*, vol. 43 (1989), pp. 301–303; Klumpp et al "Photoinduced Transformation of physiloxane layers to $SiO_2$" No month, but after Jul.

"Correlations Between Wetting and Structure in Methylsiloxane Lalyer on Oxides Formed by Chemical Vapor Surface Modification", Hiroaki Tada, Koichiro Nakamura, and Hirotsugu Nagayama, *The Journal of Physical Chemical*, vol. 98, No. 47 (Nov. 24, 1994) p. 12452–12457.

"Novel Low K Dielectrics Based on Diamondlike Carbon Materials", A. Grill, C. Jahnes, *J. Electrochemical Soc.*, vol. 145, No. 5 (May, 1998) p. 1649–1653.

Dobson et al; "Advance $SiO_2$ Planarization Using Silane and $H_2O_2$"; *Semiconductor International*, Dec. 1994, p. 85–86 and 88.

McClatchie et al., Low Dielectric Constant Flowfill Technology for IMD Applications, Feb. 10–11, 1997 Dumic Conference, pp. 34–40.

U.S. application No. 09/185,555, Second Preliminary Amendment.

U.S. application No. 09/162,915, Second Preliminary Amendment.

Paul T. Buckley and John W. Birks, "Evaluation of Visible–Light Photolysis of Ozone–Water Cluster Molecules as a Source of Atmospheric Hydroxyl Radical and Hydrogen Peroxide," Atmospheric Environment vol. 29, No. 18, pp. 2409–2415, 1995, No month.

* cited by examiner

FORMATION OF A LIQUID-LIKE SILICA LAYER BY REACTION OF AN ORGANOSILICON COMPOUND AND A HYDROXYL FORMING COMPOUND

RELATED APPLICATIONS

This application is a continuation-in-part of co-pending U.S. patent application Ser. No. 09/021,788 [AMAT/2592] which was filed on Feb. 11, 1998 now U.S. Pat. No. 6,054,379, and issued Apr. 25, 2000 U.S. patent application Ser. No. 09/247,381 [AMAT/3032. P2], which was filed on Feb. 10, 1999.

BACKGROUND OF THE DISCLOSURE

1. Field of the Invention

The present invention relates to the fabrication of integrated circuits. More particularly, the invention relates to a process and apparatus for depositing low k dielectric layers on a substrate.

2. Background of the Invention

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 $\mu$m and even 0.18 $\mu$m feature sizes, and tomorrow's plants soon will be producing devices having even smaller geometries.

In order to further reduce the size of devices on integrated circuits, it has become necessary to use insulators having low dielectric constants (k<4, preferably less than 3) as gap fill layers, pre-metal dielectric layers, inter-metal dielectric layers, and shallow trench isolation dielectric layers to reduce the capacitive coupling between adjacent metal lines. The low k insulators can be deposited directly on conductive materials or on liner/barrier layers that prevent diffusion of byproducts and contaminants such as moisture onto conductive material. For example, moisture that can be generated during formation of a low k insulator readily diffuses to the surface of the conductive metal and increases the resistivity of the conductive metal surface. A barrier/liner layer formed from conventional silicon oxide or silicon nitride materials can block the diffusion of the byproducts and contaminants. However, the barrier/liner layers, e.g., SiN, typically have dielectric constants that are significantly greater than 4.0, and the high dielectric constants result in a combined insulator that does not significantly reduce the dielectric constant.

FIG. 1A illustrates a process for depositing a gap fill layer as described in International Publication Number WO 94/01885. The PECVD process deposits a multi-component dielectric layer wherein a silicon dioxide ($SiO_2$) liner layer 2 is first deposited on a patterned metal layer having metal lines 3 formed on a substrate 4. The liner layer 2 is deposited by a plasma enhanced reaction of silane ($SiH_4$) and nitrous oxide ($N_2O$) at 300° C. A self-planarizing low k dielectric layer 5 is then deposited on the liner layer 2 by reaction of silane and a hydroxyl compound. The self-planarizing layer 5 retains moisture that is removed by curing. The liner layer 2 is an oxidized silane film that has barrier properties when deposited in a manner which provides a dielectric constant of at least 4.5. The dielectric constant of the oxidized silane film can be decreased to about 4.1 by selecting process conditions less favorable for obtaining moisture barrier properties. Conventional liner layers, such as SiN, have even higher dielectric constants, and the combination of low k dielectric layers with high k dielectric liner layers can provide little or no improvement in the overall stack dielectric constant and capacitive coupling. An optional $SiO_2$ cap layer 6 can be deposited on the self-planarizing low k dielectric layer 5 by the reaction of silane and $N_2O$.

Gap fill layers produced by reacting hydrogen peroxide with silane to form hydroxyl groups are known, but it is difficult to obtain uniform films having low dielectric constants. The thickness of the deposited layers on semiconductor substrates is typically controlled by providing exact amounts of reactants. However, hydrogen peroxide is typically stored as a solution in water and it is difficult to feed exact amounts of hydrogen peroxide and silane within the reaction chambers. Thus, there is a need for methods that combine silicon compounds and hydroxyl forming compounds that are easier to control.

U.S. Pat. No. 5,593,741, issued Jan. 14, 1997, describes a gap fill process using silicon oxide layers produced by combining organosilicon compounds such as tetraethoxysilane (TEOS, also known as tetraethylorthosilicate) with oxygen and/or ozone. The process can include an optional source of water, such as water vapor, hydrogen peroxide, or an alcohol that forms water when oxygenated. The gap fill layers are deposited subsequent to plasma enhanced deposition of a conformal layer from the same components by turning off a power source used to form a plasma. The presence of water in the reactor was believed to result in a slightly improved gap fill process.

U.S. Pat. No. 5,610,105, issued Mar. 11, 1997, describes an intermetal dielectric layer produced by low temperature PECVD of TEOS and water, followed by annealing in an oxygen atmosphere to densify the dielectric layer.

U.S. Pat. No. 5,710,079, issued Jan. 20, 1998, describes a gap fill process using silicon oxide layers produced by combining organosilicon compounds such as TEOS with ozone and water using UV light to decompose the ozone. Rapid decomposition of the ozone was assumed to form atomic oxygen that combines with water to form peroxide.

U.S. Pat. No. 5,360,646, issued Nov. 1, 1994, describes a gap fill process using silicon oxide layers produced by combining TEOS with acetic acid. The highly electronegative oxygen in TEOS reacts with hydrogen from the acetic acid to form hydroxyl groups within the deposited silicon oxide film.

The available methods for depositing silicon oxide that contains hydroxyl groups do not provide uniform dielectric layers that have low dielectric constants. Therefore, processes are desired that provide uniform deposits of silicon oxides containing hydroxyl groups deposit and having low dielectric constants.

SUMMARY OF THE INVENTION

The present invention provides a method and apparatus for uniformly depositing a silicon oxide layer having a low dielectric constant for use as a gap fill layer, a pre-metal dielectric layer, an inter-metal dielectric layer, or a shallow trench isolation dielectric layer in sub-micron devices. The method comprises reacting one or more silicon compounds that contain carbon (i.e., organosilicon compounds) with a hydroxyl forming compound at a substrate temperature less than about 400° C. The organosilicon compounds preferably contain one or more silicon-carbon bonds that remain in the deposited dielectric layers after reaction with a hydroxyl forming compound such as hydrogen peroxide or dimethyldioxirane. The hydroxyl forming compound may be produced prior to, or during deposition, such as by oxidation of water using ozone and UV light, by reaction of acetone and potassium monoperoxy sulfate to form dimethyldioxirane, or by oxidation or an organic compound that forms hydroxyls, such as oxidation of isopropyl alcohol with ozone or oxygen to produce acetone and hydrogen peroxide. In addition, the hydroxyl forming compound could be an acid such as acetic acid that provides hydrogen that reacts with siloxane compounds to form hydroxyl groups, or an acid compound that reacts with water to form hydroxyl compounds.

Preferably, the dielectric layer is produced by depositing a conformal liner layer on a patterned metal layer from process gases comprising an organosilicon compound and an oxidizing gas. The process is optionally plasma assisted using an RF power density from 0.05 W/cm$^2$ to about 1000 W/cm$^2$, preferably a power density less than about 1 W/cm$^2$, most preferably a power density ranging from about 0.1 to about 0.3 W/cm$^2$. The gap fill layer is then deposited on the liner layer at a temperature less than about 300° C. from process gases comprising the silicon compound and a hydroxyl forming compound, preferably less than about 40° C. when using organosilicon compounds that contain silicon-carbon bonds. Deposition of uniform dielectric layers is substantially enhanced by dissociation of hydroxyl forming compounds such as water in a remote microwave or RF chamber.

The organosilicon compounds that produce uniform, low k dielectric layers preferably include one or more silicon-hydrogen bonds such as methylsilane, $CH_3SiH_3$, dimethylsilane, $(CH_3)_2SiH_2$, trimethylsilane, $(CH_3)_3SiH$, and 1,1,3,3-tetramethyldisiloxane, $(CH_3)_2$—SiH—O—SiH—$(CH_3)_2$. Gap fill layers can also be uniformly deposited from other organosilicon compounds such as tetramethylsilane, $(CH_3)_4Si$, and tetraethylorthosilicate (TEOS). The silicon oxide layers are cured at low pressure and high temperature to stabilize film properties such as moisture content.

The invention also provides a substrate processing system, having a chamber comprising a reaction zone, a substrate holder for positioning a substrate in the reaction zone, and a vacuum system, a gas distribution system connecting the reaction zone of the chamber to supplies of an organosilicon compound and a hydroxyl forming compound, an RF generator coupled to the gas distribution system for generating a plasma in the reaction zone, and a controller comprising a computer for controlling the chamber, the gas distribution system, and the RF generator. The controller has a memory coupled to the controller, the memory comprising a computer usable medium comprising a computer readable program code for selecting a process that deposits gap fill layers, pre-metal dielectric layers, inter-metal dielectric layers, or shallow trench isolation dielectric layers in sub-micron devices.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF A PREFERRED EMBODIMENT

Figure 1A:
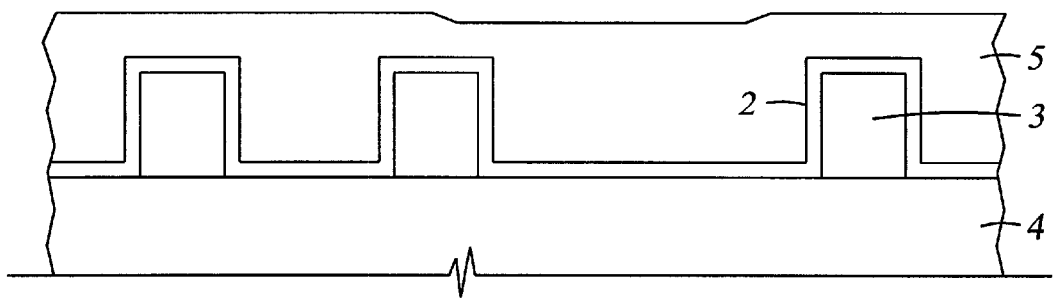
FIG. 1A–1B (Prior Art) are schematic diagrams of dielectric layers deposited on a substrate by the processes known in the art.
Figure 1B:
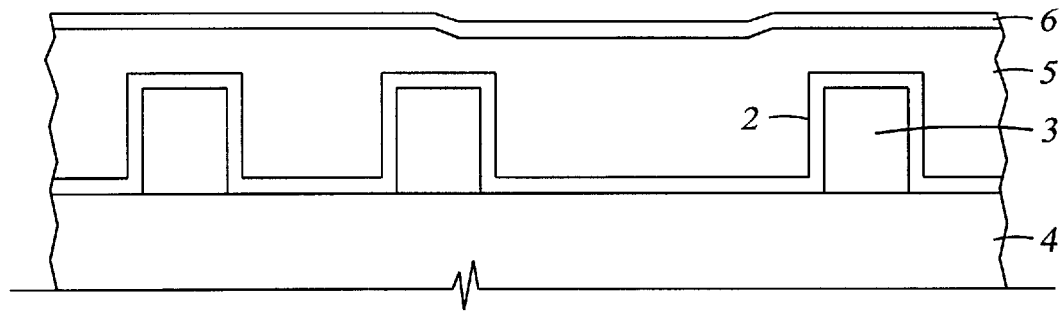

The present invention provides a method and apparatus for uniformly depositing a silicon oxide layer having a low dielectric constant (k<about 4). The silicon oxide layer is produced by reacting an organosilicon compound, such as an organosilane or organosiloxane, with a hydroxyl forming compound such as $H_2O_2$, dimethyldioxirane, acetic acid, or water at a substrate temperature less than about 400° C. The silicon oxide layer can be used as a gap fill layer, a pre-metal dielectric layer, an inter-metal dielectric layer, and a shallow trench isolation dielectric layer in sub-micron devices. The silicon oxide layer is cured at temperatures less than about 500° C. to form a carbon doped silicon oxide film.

When deposited at substrate temperatures less than about 40° C., the dielectric layer is self-planarizing and is well-suited for filling submicron gaps between metal lines. A gap-fill layer of the present invention is preferably deposited on a liner layer that is deposited by plasma assisted oxidation of the same or different organosilane or organosiloxane compounds. Carbon which remains in the silicon oxide layer contributes to the low dielectric constant. The remaining carbon is between about 1% and about 50% by atomic weight when the organosilicon compound contains one or more Si—C bonds.

The silicon oxide layers are preferably produced from silicon compounds that include at least one Si—C bond, preferably at least two Si—C bonds, that is not readily removed by oxidation at processing conditions. Suitable organo groups also can include alkenyl and cyclohexenyl groups and functional derivatives. Such organosilicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| tetramethylsilane, | $(CH_3)_4Si$ |
| tetraethoxysilane, | $(CH_3$—$CH_2$—O—$)_4$—$Si$ |
| dimethylsilanediol, | $(CH_3)_2$—$Si$—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—$Si$—$(OH)_3$ |

-continued

| | |
|---|---|
| methylphenylsilane, | $C_6H_5$—$SiH_2$—$CH_3$ |
| disilanomethane, | $SiH_3$—$CH_2$—$SiH_3$ |
| bis(methylsilane)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-tri-methylene, | —($SiH_2CH_2$—)$_3$— (cyclic) |
| 1,3-dimethyldisiloxane, | $CH_3$—$SiH_2$—O—$SiH_2$—$CH_3$ |
| 1,1,3,3-tetramethyldisiloxane, | $(CH_3)_2$—SiH—O—SiH—$(CH_3)_2$ |
| hexamethyldisiloxane, | $(CH_3)_3$—Si—O—Si—$(CH_3)_3$ |
| 1,3-bis(silanomethylene)di-siloxane, | $(SiH_3$—$CH_2$—$SiH_2$—)$_2$—O |
| bis(1-methyldisilox-anyl)methane, | $(CH_3$—$SiH_2$—O—$SiH_2$—)$_2$—$CH_2$ |
| 2,2-bis(1-methyldisilox-anyl)propane, | $(CH_3$—$SiH_2$—O—$SiH_2$—)$_2$—$C(CH_3)_2$ |
| 2,4,6,8-tetramethylcyclotetra-siloxane, | —($SiHCH_3$—O—)$_4$— (cyclic) |
| octamethylcyclotetrasiloxane, | —($Si(CH_3)_2$—O—)$_4$— (cyclic) |
| 2,4,6,8,10-pentamethylcyclo-pentasiloxane, | —($SiHCH_3$—O—)$_5$— (cyclic) |
| 1,3,5,7-tetrasilano-2,6-dioxy-4,8-dimethylene, | —($SiH_2$—$CH_2$—$SiH_2$—O—)$_2$— (cyclic) |
| 2,4,6-trisilanetetrahydropyran, and | —$SiH_2$—$CH_2$—$SiH_2$—$CH_2$—$SiH_2$—O— (cyclic) |
| 2,5-disilanetetrahydrofuran. | —$SiH_2$—$CH_2$—$CH_2$—$SiH_2$—O— (cyclic) |

When a gap fill layer is deposited on a liner layer, the liner layers are preferably prepared by oxidizing an organo silicon compound, such as listed above, with oxygen ($O_2$) or oxygen containing compounds such as nitrous oxide ($N_2O$), ozone ($O_3$), or carbon dioxide ($CO_2$), preferably $O_2$ or $N_2O$, such that the carbon content of the deposited film is from about 1 to about 50% by atomic weight, preferably from about 5 to about 30%. The oxidized organo silicon layer has a dielectric constant of about 3.0 and has excellent barrier properties. The oxidized organo silicon layers further have high oxide content in comparison to conventional low k dielectric layers and good adhesion properties.

Oxidizing compounds are preferably dissociated to increase reactivity prior to entering a reaction chamber. RF power can also be coupled to the deposition chamber to increase dissociation of the oxidizing compounds. The oxidizing compounds may also be dissociated in a remote microwave chamber or remote plasma chamber prior to entering the deposition chamber to reduce excessive dissociation of the silicon containing compounds. Deposition of the silicon oxide layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited film. During deposition of the silicon oxide layer, the substrate is maintained at a temperature of from about −20° C. to about 400° C., and preferably is maintained at a temperature of approximately −20° C. to 40° C.

For the gap fill layers, an organosilicon compound as described above is oxidized during deposition by reaction with a hydroxyl forming compound such as by reaction with hydrogen peroxide ($H_2O_2$), which can be produced in the reaction system by combining ozone ($O_3$) and water ($H_2O$)$_2$ preferably in the presence of UV light having a wavelength of about 254 nanometers as described in U.S. Pat. No. 5,710,079 (which is incorporated by reference herein), by reaction with an oxirane compound such as dimethyldioxirane as described below, by oxidation of an organic compound as described in U.S. Pat. No. 4,303,632 (which is incorporated by reference herein), or by reaction with acetic acid as described in U.S. Pat. No. 5,360,646 (which is incorporated by reference herein). The hydroxyl forming compounds are also preferably dissociated in a remote RF or microwave chamber. Preferably, the gap fill layer has a carbon content that is from about 1 to about 50 % by atomic weight, most preferably about 5 to about 30%. During deposition of the gap fill layer, the substrate is maintained at a temperature from about −20° C. to about 400° C., and preferably a temperature from about −20° C. to about 40° C. for organosilicon compounds containing Si—C bonds. After curing at a temperature greater than about 400° C., the gap fill layer has a dielectric constant less than-about 3.5. The oxidized organo silicon layers further have good adhesion properties.

The organosilicon compounds reacted with the hydroxyl forming compounds may also be used to prepare the oxidized liner layers having good barrier properties. When used to prepare the liner layers, the organosilicon compounds preferably include the structures:

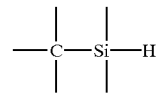

wherein each Si is bonded to one or two carbon atoms, and C is included in an organo group, preferably alkyl or alkenyl groups such as —$CH_3$, —$CH_2$—$CH_3$, —$CH_2$—, or —$CH_2$—$CH_2$—, or fluorinated carbon derivatives thereof. The carbon atoms in the fluorinated derivatives may be partially or fully fluorinated to replace hydrogen atoms. When an organosilane or organosiloxane compound includes two or more Si atoms, each Si is separated from another Si by —O—, —C—, or —C—C—, wherein C is included in an organo group, preferably alkyl or alkenyl groups such as —$CH_2$—, —$CH_2$—$CH_2$—, —$CH(CH_3)$— or —$C(CH_3)_2$—, or fluorinated derivatives thereof.

The hydrocarbon groups in the organosilicon compounds be partially or fully fluorinated to convert C—H bonds to C—F bonds. Many of the preferred organosilicon compounds are commercially available. A combination of two or more of the organosilicon compounds can be employed to provide a blend of desired properties such as dielectric constant, oxide content, hydrophobicity, film stress, and plasma etching characteristics.

Reaction of the organosilicon compounds with hydroxyl forming compounds can occur with addition of thermal, RF, or microwave energy to dissociate the gaseous reactants, and preferably any dissociation occurs prior to entering the reactor. The oxidized compounds adhere to cooler surfaces such as a substrate to form a deposited film. The deposited films are cured within the deposition chambers to remove water at temperatures from about 100 to about 500° C., preferably above about 400° C. to improve moisture barrier properties of the films. The deposited film has sufficient carbon content to provide barrier properties.

The present invention further provides a substrate processing system having a chamber including a reaction zone, a substrate holder for positioning a substrate in the reaction zone, and a vacuum system. The processing system further comprises a gas distribution system connecting the reaction zone of the chamber to supplies of an organosilane or organosiloxane compound, an oxidizing gas, and an inert gas, and an RF generator coupled to the gas distribution system for generating a plasma in the reaction zone. The gas distribution system may include a supply of a hydroxyl forming compound such as dimethyldioxirane or a gas/liquid injection system for mixing gaseous reactants, such as acetone and potassium monoperoxy sulfate, or vaporizing a liquid reactant such as water, hydrogen peroxide, or an organic compound that oxidizes to form hydroxyl forming compounds and volatile byproducts. The processing system further comprises a controller comprising a computer for controlling the chamber and the gas distribution system, and a memory coupled to the controller, the memory comprising a computer usable medium comprising a computer readable program code for selecting the process steps of depositing a low dielectric constant film by reacting an organosilicon compound with a hydroxyl forming compound.

Further description of the invention relates to a specific apparatus for depositing silicon oxide layers of the present invention and to preferred silicon oxide films.

Exemplary CVD Plasma Reactor

Figure 2:
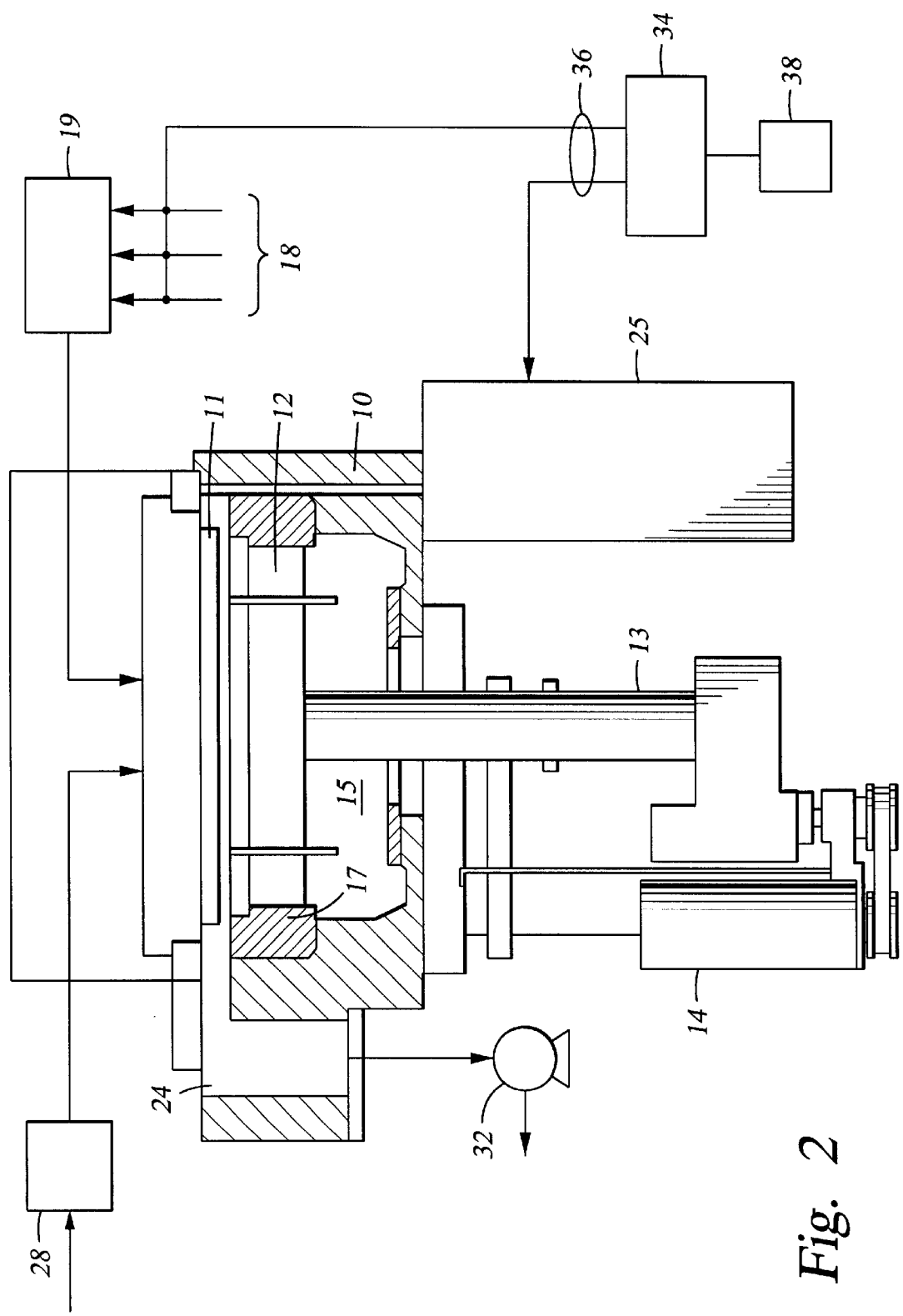
FIG. 2 is a cross-sectional diagram of an exemplary CVD plasma reactor configured for use according to the present invention.

One suitable CVD reactor in which a method of the present invention can be carried out is shown in FIG. 2, which is a vertical, cross-section view of a parallel plate chemical vapor deposition reactor 10 having a high vacuum region 15. Reactor 10 contains a gas distribution manifold 11 for dispersing process gases through perforated holes in the manifold to a substrate or wafer (not shown) that rests on a substrate support plate or susceptor 12 which is raised or lowered by a lift motor 14. A liquid injection system (not shown), such as typically used for liquid injection of TEOS, may also be provided for injecting a liquid organosilane and/or organosiloxane compound. The preferred organosilicon compounds are gases.

The reactor 10 includes heating of the process gases and substrate, such as by resistive heating coils (not shown) or external lamps (not shown). Referring to FIG. 2, susceptor 12 is mounted on a support stem 13 so that susceptor 12 (and the substrate supported on the upper surface of susceptor 12) can be controllably moved between a lower loading/off-loading position and an upper processing position which is closely adjacent to manifold 11.

When susceptor 12 and the substrate are in processing position 14, they are surrounded by an insulator 17 and process gases exhaust into a manifold 24. During processing, gases inlet to manifold 11 are uniformly distributed radially across the surface of the substrate. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. The oxidizing gas may optionally be introduced through an additional chamber 28 such as a UV light chamber for decomposition of ozone, a liquid injection system as described for FIG. 3 for vaporizing hydrogen peroxide or other organic compounds, a microwave applicator for dissociation of oxidizing gases such as water or $N_2O$, or another energy source, such as a remote RF applicator, that assists with activation of process gases. Generally, the process gas supply line 18 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or an RF or microwave enhanced process. In one embodiment, a controlled plasma is typically formed adjacent to the substrate by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12. The silicon oxide layers of the present invention are most preferably produced using low levels of constant high frequency RF power or pulsed levels of high frequency RF power. Pulsed RF power preferably provides 13.56 MHz RF power at about 20 W to about 500 W, most preferably from 20 W to about 250 W, during about 10% to about 30% of the duty cycle. Constant RF power preferably provides 13.56 MHz RF power at about 10 W to about 200 W, preferably from about 20 W to about 100 W. Low power deposition preferably occurs at a temperature range from about −20° C. to about 40° C. At the preferred temperature range, the deposited film is partially polymerized during deposition and polymerization is completed during subsequent curing of the film.

When dissociation of an oxidizing gas or hydroxyl forming compound is desired, an optional microwave chamber 28, described in more detail below for FIG. 3, or remote RF plasma chamber, inputs from 0 to 3000 W of power to the oxidizing gas, such as water, $O_2$, or $N_2O$, prior to entering the deposition chamber. Separate addition of microwave or RF power to the process gas avoids excessive dissociation of the silicon compounds prior to reaction with the dissociated gas. A gas distribution plate having separate passages for the silicon compound and the process gas is preferred when microwave power is added to one of the process gases.

Typically, any or all of the chamber lining, distribution manifold 11, susceptor 12, and various other reactor hardware is made out of material such as aluminum, anodized aluminum, or ceramic. An example of such a CVD reactor is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The lift motor 14 raises and lowers susceptor 12 between a processing position and a lower, substrate-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

The system controller 34 operates under the control of a computer program stored on the hard disk drive 38. The computer program dictates the timing, mixture of gases, RF power levels, susceptor position, and other parameters of a particular process.

Figure 3:
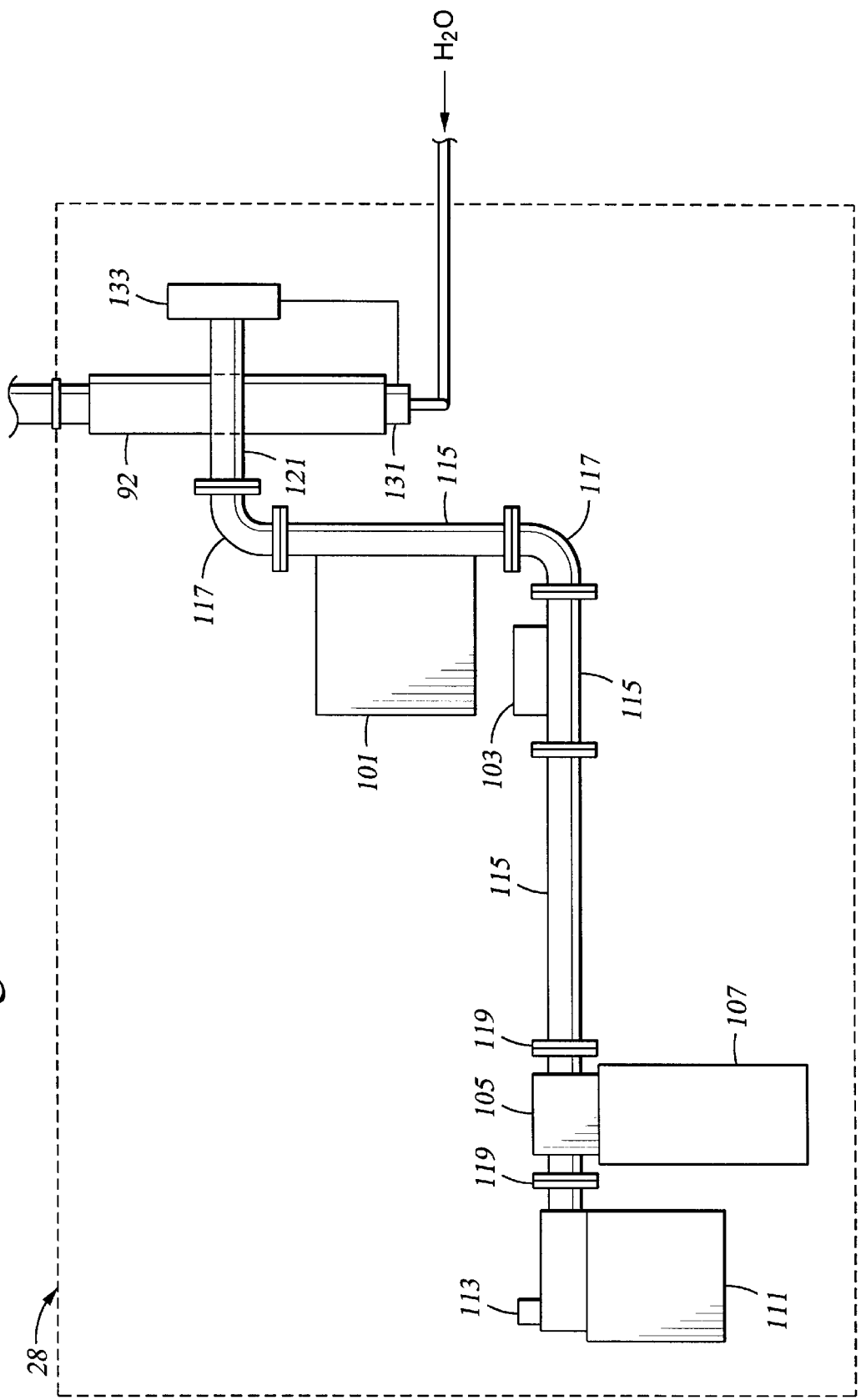
FIG. 3 is a schematic diagram of a remote microwave chamber for dissociation of process gases prior to entering the reactor of FIG. 2.

FIG. 3 is a simplified diagram of a remote microwave chamber 28 for dissociating process gases such as water prior to entering the reactor 10, in accordance with an embodiment of the present invention. Remote microwave chamber 28 includes an applicator tube 92, a plasma ignition system including an ultraviolet (UV) lamp 131 and a UV power supply 133, a microwave waveguide system that includes various lengths of straight and curved waveguide sections 115, 117, which may be connected together at joints 119, an output waveguide section 121, optimizing elements including an impedance matching system 101, which may include an optional phase detector 103 for embodiments requiring feedback for automatic impedance matching, a circulator 105 with a load 107; and a magnetron 111.

Magnetron 111 is a typical magnetron source capable of operating between about 0–3000 Watts for continuous wave (CW) or pulsed output of microwaves of about 2.45 Gigahertz (GHz) frequency. Of course, other magnetrons may be utilized as well. Circulator 105 allows only forward microwave transmission from magnetron 111 toward applicator tube 92. Load 107 absorbs any power that might be reflected back from the waveguide system toward magnetron 711. Circulator 105 connects to waveguide section 115 that is connected to phase detector 103 connected to another waveguide section 115. Phase detector 103, if utilized, is coupled via curved waveguide section 117 to another waveguide section 115 having an attached tuning or matching system 101. Tuning system 101, which may use stub tuners or other tuning elements, provides the microwave chamber 28 with the ability to match the load at waveguide section 121 to the characteristic impedance of the waveguides. Tuning system 101 may provide fixed tuning, manual tuning, or automated tuning, according to specific embodiments. For embodiments using automated tuning, phase detector 103 is a 3-diode array which detects the phase of microwaves transmitted for feedback to matching system 101, which intelligently and dynamically matches the load appropriately. In the specific embodiment, the waveguide sections have rectangular cross-sections, but other types of waveguide also may be used.

Applicator tube 92 is a circular (or other cross-section) tube made of a composite or ceramic material, preferably alumina, or other material resistant to etching by radicals. In a specific embodiment, applicator tube 92 has a length of about 18–24 inches and a cross-sectional diameter of about 3–4 inches. Applicator tube 92 is disposed through a waveguide section 121, which is open at one end for transmitting microwaves and is terminated at the other end with a metal wall. Microwaves are transmitted through the open end of waveguide section 121 to gases inside applicator tube 92, which is transparent to microwaves. Of course, other materials such as sapphire also may be used for the interior of applicator tube 92. In other embodiments, applicator tube 92 may have a metal exterior and an interior made of a composite or ceramic material wherein microwaves in waveguide section 121 enter a window through the exterior of applicator tube 92 to the exposed interior of tube 92 to energize the gases.

Figure 4:
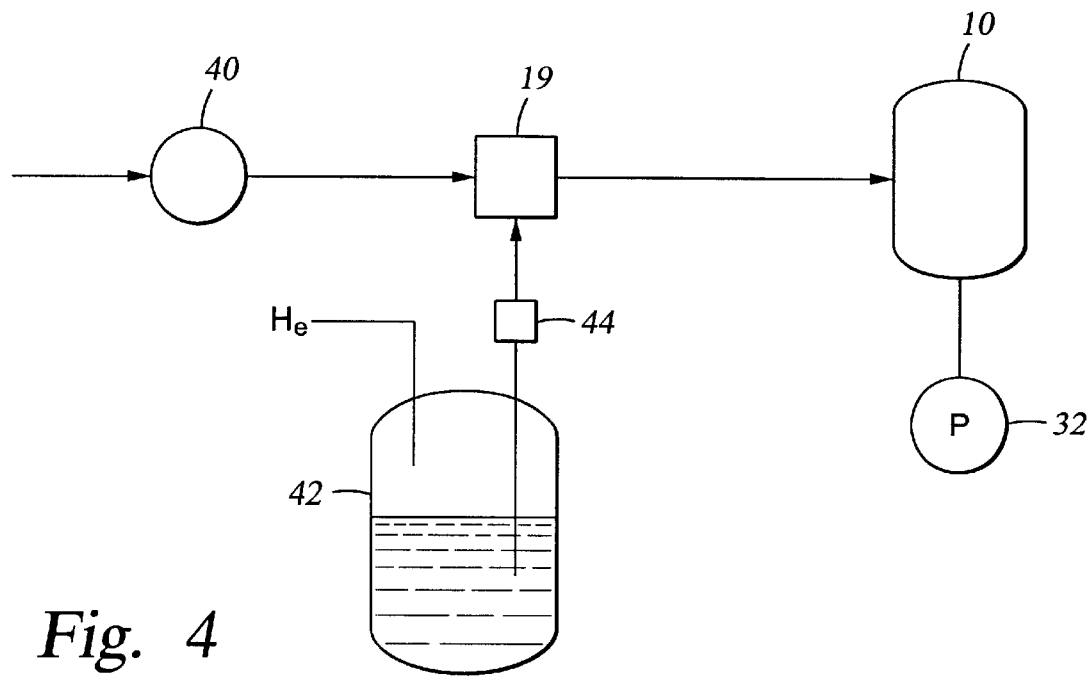
FIG. 4 is a diagram of a liquid injection system for controlling the supply of liquids such as water and hydrogen peroxide to the reactor of FIG. 2.

FIG. 4 shows an alternative method for providing a hydroxyl compound to the reactor 10. For this embodiment, the optional chamber 28 in FIG. 2 is a liquid injection system 42 having a flow controller 44 that precisely meters flow of water, hydrogen peroxide, or other liquid reactants, such as 2-ethyl-anthrahydroquinone, benzhydrol, or isopropyl alcohol, prior to volatilization and mixing with other gases, such as oxygen and/or ozone, in the mixing chamber 19. The uniform flow of liquid from the injection system 42 is obtained by introducing a non-reactive gas, typically helium, into the system 42 and displacing a known volume of liquid. The liquid is optionally vaporized in an energy chamber 44 such as a microwave chamber or a UV chamber prior to entering the mixing chamber 19. The flow of oxidizing gas or hydroxyl forming gas is measured with a flow meter 40 to provide precise control of the flow of reactants. The reactor pump 32 draws the combined gases from the mixing chamber 19. Of course, the combined gases could also be passed through a microwave chamber 28 or other chamber to dissociate the gas as described for FIG. 3.

Figure 5:
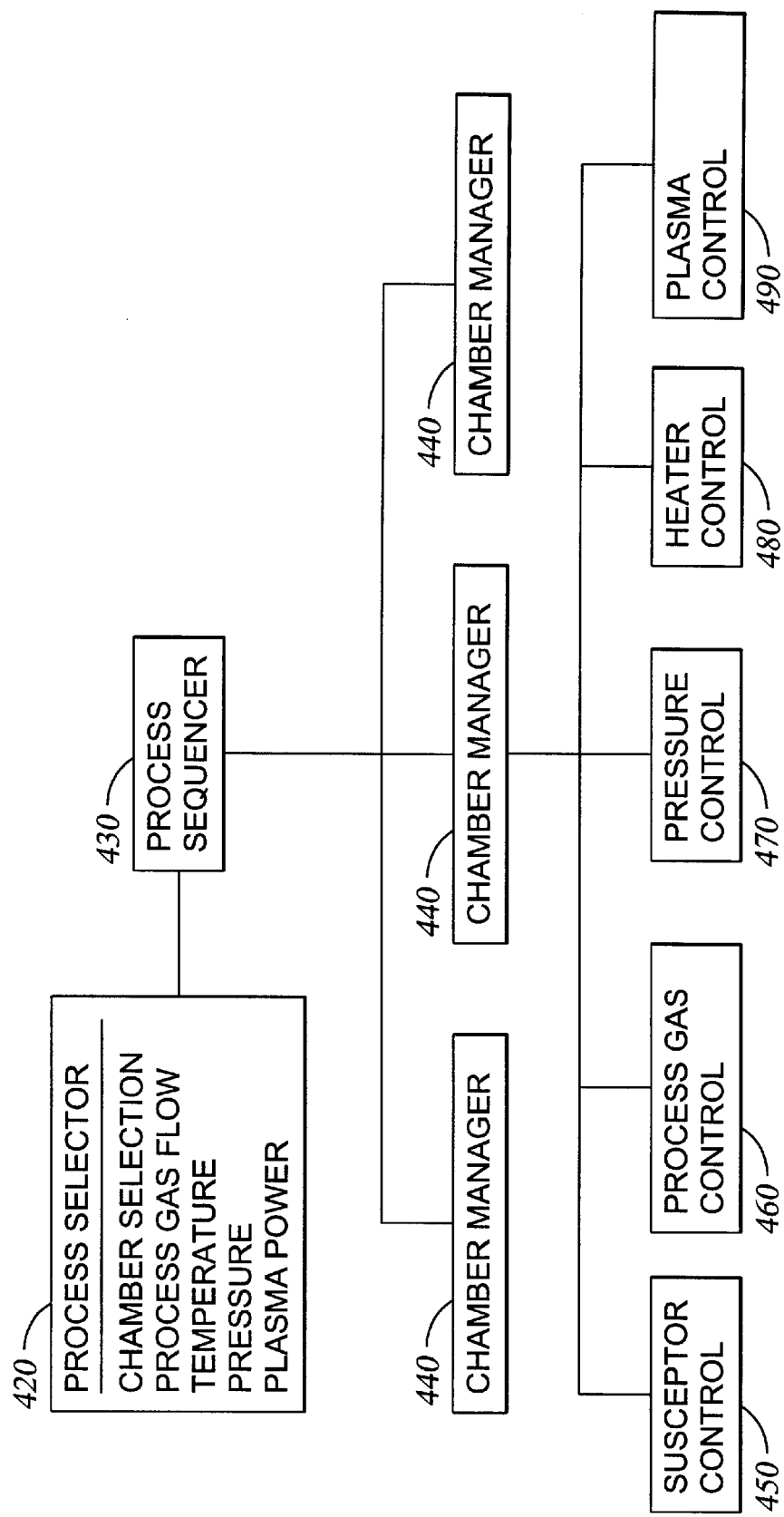
FIG. 5 is a flow chart of a process control computer program product used in conjunction with the exemplary reactor of FIG. 2.

Referring to FIG. 5, the process of the invention can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

FIG. 5 shows an illustrative block diagram of the hierarchical control structure of the computer program 410. A user enters a process set number and process chamber number into a process selector subroutine 420. The process sets are predetermined sets of process parameters necessary to carry out specified processes, and are identified by predefined set numbers. The process selector subroutine 420 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a reactor 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which reactor 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 5. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, a non-reactive gas such as helium, argon, or nitrogen is flowed into the reactor 10 to stabilize the pressure in the chamber before reactive process gases are introduced into the chamber. For these processes, the process gas control subroutine 460 is programmed to include steps for flowing the inert gas into the reactor 10 for an amount of time necessary to stabilize the pressure in the chamber, and then the steps described above would be carried out. Additionally, when a process gas is to be vaporized from a liquid precursor, for example isopropyl alcohol, the process gas control subroutine 460 would be written to include steps for bubbling a delivery gas such as ozone through the liquid precursor in a bubbler 42. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor.

Figure 6:
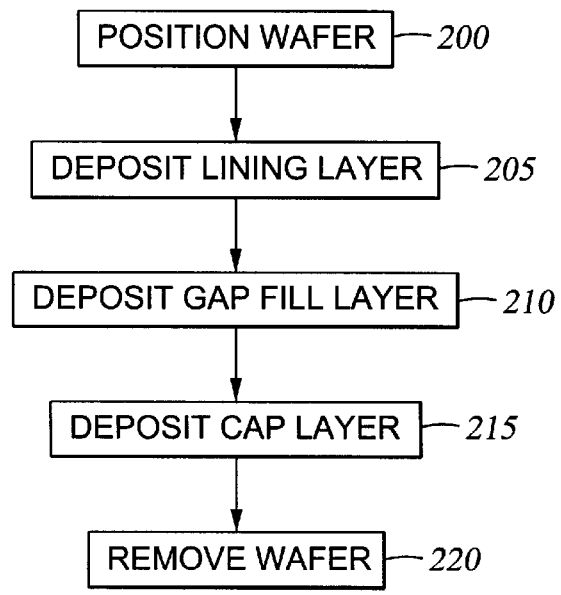
FIG. 6 is a flow chart illustrating steps undertaken in depositing liner and cap layers in a gap fill process according to one embodiment of the present invention.

Deposition of the Oxidized Organosilane or Organosiloxane Dielectric in a Three-Layer Gap Fill Process The oxidized organosilane or organosiloxane layer of the present invention can be used to replace silicon oxide layers in most applications. An embodiment that demonstrates the versatility of the present invention is a three-layer gap fill process as shown in FIG. 6 using the reactor of FIG. 2. Referring to FIG. 6, a substrate is positioned 200 in the reactor 10 and an oxidized organosilane layer having a low dielectric constant is deposited 205 by a PECVD process from a plasma comprising an organosilane compound and/or an organosiloxane compound, and an oxidizing gas such as $O_2$ or $N_2O$. The deposition step 205 can include a capacitively coupled plasma or both an inductively and a capacitively coupled plasma in the chamber 15 according to methods known in the art. An inert gas such as helium is commonly used in the PECVD process to assist in plasma generation. A gap fill layer is then deposited 210 on the liner layer in accordance with the present invention, preferably by reacting an organosilane or organosiloxane compound used to produce the liner layer with a hydroxyl forming compound. The gap fill layer is preferably self-planarizing, and preferably is hydrophobic after curing to remove water. A cap layer is then deposited 215 on the gap fill layer, preferably using the same process for depositing the liner layer. The substrate is then removed 220 from the reactor 10.

Figure 7A:
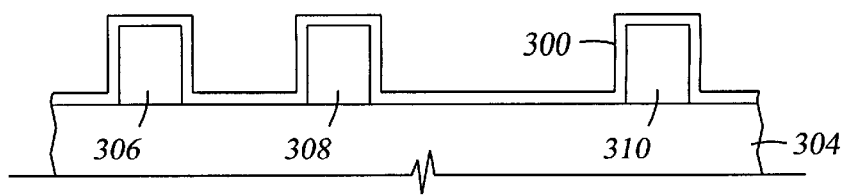
FIG. 7A–7E is a schematic diagram of the layers deposited on a substrate by the process of FIG. 6.

Referring to FIGS. 7A–7E, the three-layer gap fill process provides a PECVD liner layer 300 of the oxidized organosilane or organosiloxane polymer. The liner layer 300 acts as an isolation layer between a subsequent gap fill layer 302 and the underlying substrate surface 304 and metal lines 306, 308, 310 formed on the substrate surface. The gap fill layer 302 is capped by a PECVD capping layer 312 of the oxidized organosilane or organosiloxane polymer. This process is implemented and controlled using a computer program stored in the memory 38 of a computer controller 34 for a CVD. reactor 10. Referring to FIG. 7A, the PECVD liner layer 300 is deposited in the reactor 10 by introducing an oxidizing gas such as $N_2O$, an organosilane or organosiloxane compound such as methylsilane ($CH_3SiH_3$), trimethylsilane (($CH_3)_3SiH$), or the like, and a carrier gas such as helium. The substrate is maintained at a temperature of from about $-20°$ C. to about $400°$ C., and preferably is maintained at a temperature of approximately $-20°$ C. to $40°$ C. throughout the deposition of the PECVD liner layer. The PECVD liner layer 300 is deposited with a process gas that includes a mixture of the organosilane and/or organosiloxane compound at a flow rate of about 5 sccm to about 500 sccm and the oxidizing gas at a flow rate of about 5 sccm to about 2000 sccm. The process gases are carried by an inert gas such He, Ar, or a relatively inert gas such as nitrogen, which are typically not incorporated into the film, at a flow rate of from about 200 sccm to about 20,000 sccm. The process gases react at a pressure from about 0.2 to about 20 Torr, preferably less than about 10 Torr, to form a conformal silicon oxide layer on the substrate surface 304 and metal lines 306, 308, 310. The reaction is plasma enhanced with a power density ranging from about 0.05 $W/cm^2$ to about 1000 $W/cm^2$, preferably a power density less than about 1 $W/cm^2$, most preferably a power density ranging from about 0.1 to about 0.3 $W/cm^2$.

For an 8" single substrate chamber, the high frequency RF source of approximately 13.56 MHz is preferably connected to a gas distribution system and driven at about 10 to about 500 W while a low frequency RF source of about 350 KHz to 1 MHz is optionally connected to a susceptor and driven at about 0 to about 100 W. In a preferred embodiment, the high frequency RF source is driven at about 20 W to about 250 W of pulsed RF power, and the low frequency RF source is driven at about 0 to about 50 W of pulsed RF power at a duty cycle from about 10% to about 30%. The pulsed RF power is preferably cycled in short intervals, most preferably having a frequency less than about 200 Hz. When the high frequency RF power is constant, the power level preferably ranges from about 20 W to about 100 W.

The oxidized organosilane or organosiloxane layer is then cured at a pressure less than about 10 Torr a temperature from about $300°$ C. to about $500°$ C. Optionally, curing could be conducted after deposition of additional dielectric layers.

Figure 7B:
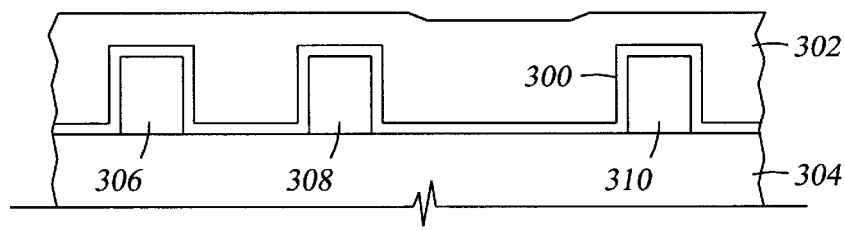

The above process conditions result in the deposition of a PECVD liner layer 300 at about 2000 Å per minute with improved barrier characteristics for the subsequent deposition of the gap fill layer 302 shown in FIG. 7B. The liner layer obtained from methylsilane has sufficient C—H bonds to be hydrophobic, and is an excellent moisture barrier. Deposition of a hydrophobic liner layer has a surprising and unexpected result of converting subsequent hydrophilic gap filling layers to hydrophobic layers having good moisture barrier properties.

The process gases for the gap fill layer 302 may include any organosilicon compound, but preferably include the same organosilicon compounds used for the liner layer. The process gases further include a hydroxyl forming compound such as hydrogen peroxide, dimethyldioxirane, water, and isopropyl alcohol. Hydrogen peroxide is preferably about 50 wt % of hydrogen peroxide ($H_2O_2$) which is vaporized and mixed with an inert carrier gas, such as helium. The hydroxyl forming compound can alternatively be formed in the reaction system as previously described.

The process gas flows range from 0–8000 sccm for He, 10–1200 sccm for the organosilicon compound, such as $(CH_3)_xSiH_{4-x}$, and 20–3000 sccm for the hydroxyl forming compound, such as $H_2O_2$ or dimethyldioxirane. The preferred gas flows range from 500–4000 sccm for He, 100–500 sccm for $(CH_3)_xSiH_{4-x}$, and 100–1000 sccm for hydroxyl forming compounds. These flow rates are for a chamber having a volume of about 5.5 to 6.5 liters. When hydroxyl forming compounds are produced by oxidation of water or other compounds, the flows range from 2,000–6,000 sccm for oxidizing gases, such as oxygen, containing about 6–20 wt % ozone, and from 500–2000 mg/min for water or other hydroxyl sources.

Figure 7C:
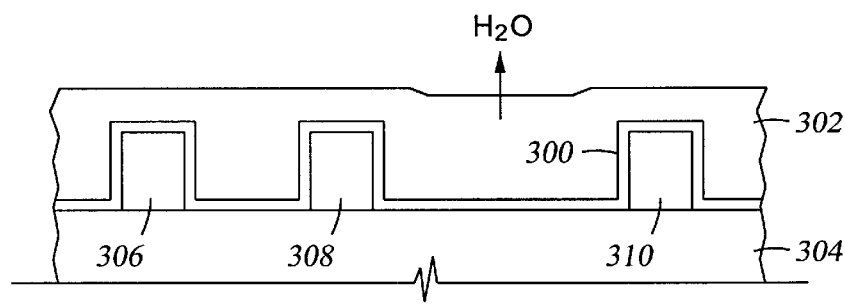
Figure 7D:
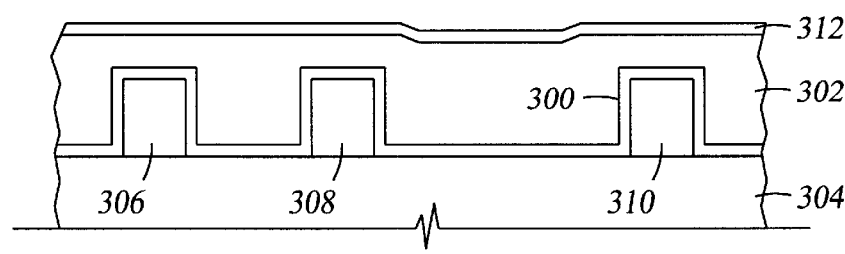

Preferably, reactor 10 is maintained at a pressure of about 0.2 to about 5 torr and maintains a substrate temperature less than about 40° C. during deposition of the gap fill layer 302. The temperature of the gas distribution system within the reactor preferably is maintained at a temperature from about 70° C. to about 130° C. The gap fill layer 302 may be partially cured as shown in FIG. 7C to remove solvents such as water prior to deposition of a cap layer 312 as shown in FIG. 7D. Curing is preferably done in a thermal annealing chamber or in the reactor 10 by maintaining a vacuum under 10 Torr in an inert gas atmosphere.

Gap fill layers produced from methylsilane are typically hydrophilic and have poor moisture barrier properties. When deposited on a liner layer produced from methylsilane, a gap fill layer produced from methylsilane is hydrophobic and has good moisture barrier properties.

Figure 7E:
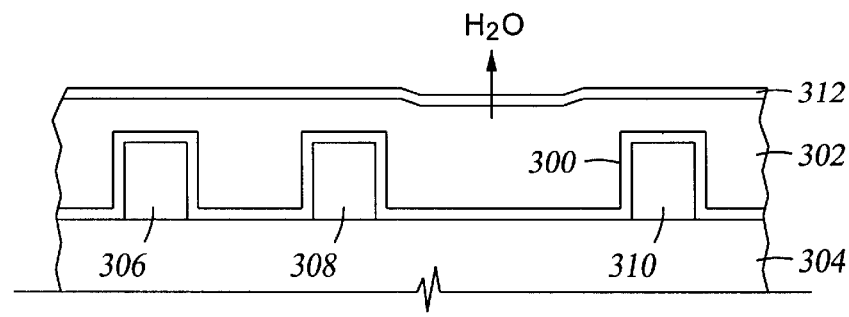

Referring to FIG. 7D, after deposition of the gap fill layer 302, the reactor 10 optionally resumes deposition of the oxidized organosilane or organosiloxane layer of the present invention for deposition of a capping layer 312. Referring to FIG. 7E, after deposition of the capping layer, if any, the deposited layers are cured in a furnace or another chamber at a temperature from about 300° C. to about 500° C. to drive off remaining solvent or water. Of course, processing conditions will vary according to the desired characteristics of the deposited films.

The invention is further described by the following examples.

EXAMPLES

The following examples illustrate reaction of an organosilicon compound and hydroxyl forming compounds to deposit dielectric layers having low dielectric constants. The examples refer to a chemical vapor deposition chamber, and in particular, a "CENTURA DxZ" system which includes a solid-state RF matching unit with a two-piece quartz process kit, both fabricated and sold by Applied Materials, Inc., Santa Clara, Calif.

Peroxide Source (Hypothetical)

An oxidized trimethylsilane film is deposited at a chamber pressure of 3.0 Torr and a substrate temperature of 0° C. from reactive gases which are flowed into the reactor as follows:

| | |
|---|---|
| Trimethylsilane, $(CH_3)_3SiH$, at | 200 sccm |
| Peroxide, $H_2O_2$, at | 500 sccm |
| Helium, He, at | 1000 sccm. |

The substrate is positioned from 200–1000 mils from the gas distribution showerhead, preferably 600 mils, and deposition occurs to a depth from about 1000 Å to 2 μm. The film is then cured at a temperature of 400° C. for about 30 to about 120 minutes. The oxidized trimethylsilane material is estimated to have a dielectric constant less than about 3.0.

First Hydroxyl Source (Hypothetical)

An oxidized trimethylsilane layer is deposited at a chamber pressure of 3.0 Torr and a substrate temperature of 25° C. from reactive gases which are flowed into the reactor as follows:

| | |
|---|---|
| Trimethylsilane, $(CH_3)_3SiH$, at | 500 sccm |
| Isopropyl Alcohol, at | 1000 mg/min |
| Ozone, $O_2$ with 12 wt % $O_3$, at | 5000 sccm |
| Helium, He, at | 4000 sccm | wherein the isopropyl alcohol is mixed with some helium and combined with the ozone and additional helium in a mixing chamber. The substrate is positioned 600 mil from the gas distribution showerhead. The layer is then cured at a temperature of 400° C. for about 30 to about 120 minutes. The oxidized trimethylsilane material is estimated to have a dielectric constant less than about 3.0.

Second Hydroxyl Source (Hypothetical)

A dimethylsilane layer is deposited at a chamber pressure of 3.0 Torr and a substrate temperature of 25° C. from reactive gases which are flowed into the reactor as follows:

| | |
|---|---|
| Dimethylsilane, $(CH_3)_2SiH_2$, at | 60 sccm |
| Dimethyldioxirane, at | 200 sccm |
| Helium, He, at | 1000 sccm | wherein the dimethyldioxirane is first prepared by reaction of acetone and potassium monoperoxy sulfate in a liquid injection system. The dimethyldioxirane is a gas at room temperature and is combined with helium in a mixing chamber. The substrate is positioned 600 mil from the gas distribution showerhead. The layer is then cured at a temperature of 400° C. for about 30 to about 120 minutes. After curing, the oxidized dimethylsilane material is estimated to have a dielectric constant less than about 3.0.

While the foregoing is directed to preferred embodiments of the present invention, other and further embodiments of the invention may be devised without departing from the basic scope thereof, and the scope thereof is determined by the claims which follow.

What is claimed is:

1. A process for filling gaps between conductive materials on a semiconductor substrate, comprising:

reacting a silicon compound selected from a group consisting of methylsilane, dimethylsilane, trimethylsilane, and combinations thereof, with a hydroxyl forming compound produced from an oxidizing gas comprising oxygen ($O_2$) and about 6–20 wt % of ozone ($O_3$) to deposit a film comprising silicon-carbon bonds on a patterned semiconductor substrate; and curing the film to obtain a dielectric constant less than about 3.5.

2. The process of claim 1, wherein the silicon compound is trimethylsilane.

3. The process of claim 1, wherein the ozone reacts with water vapor to form the hydroxyl forming compound.

4. A process for depositing a low dielectric constant film, comprising:

depositing a first dielectric layer comprising silicon, oxygen, and carbon from process gases comprising trimethylsilane and a hydroxyl forming compound produced from an oxidizing gas comprising oxygen ($O_2$) and about 6–20 wt % of ozone ($O_3$);

depositing a second dielectric layer on the first dielectric layer; and curing the first dielectric layer to obtain a dielectric constant less than about 3.5.

5. The process of claim 4, wherein the ozone is reacted wiht water vapor to form the hydroxyl forming compound.

6. The process of claim 4, wherein the first dielectric layer comprises silicon-carbon bonds and has from 1% to 50% carbon by atomic weight.

\* \* \* \* \*

UNITED STATES PATENT AND TRADEMARK OFFICE
CERTIFICATE OF CORRECTION

PATENT NO.    : 6,413,583 B1
DATED         : July 2, 2002
INVENTOR(S)   : Moghadam et al.

It is certified that error appears in the above-identified patent and that said Letters Patent is hereby corrected as shown below:

<u>Column 16,</u>
Line 60, please change "trlmethylsilane" to -- trimethylsilane --.

<u>Column 18,</u>
Line 6, please change "wiht" to -- with --.

Signed and Sealed this

Tenth Day of June, 2003

JAMES E. ROGAN
*Director of the United States Patent and Trademark Office*